(12) United States Patent
Nakanishi et al.

(10) Patent No.: US 6,441,406 B1
(45) Date of Patent: Aug. 27, 2002

(54) SEMICONDUCTOR DEVICE

(75) Inventors: Hidetoshi Nakanishi, Yokohama; Masakazu Kobayashi, Kawasaki; Toshio Chaki, Hyogo-ken, all of (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/981,870

(22) Filed: Oct. 19, 2001

(30) Foreign Application Priority Data

Oct. 20, 2000 (JP) ...................................... 2000-320526

(51) Int. Cl.[7] .............................................. H01L 29/74
(52) U.S. Cl. ......................... 257/119; 257/124; 438/133
(58) Field of Search ................................ 257/119, 124, 257/107, 144, 145, 142; 438/133, 135, 137, 138

(56) References Cited

U.S. PATENT DOCUMENTS 5,661,314 A * 8/1997 Merrill et al. ............... 257/144
5,960,264 A * 9/1999 Takahashi ................... 438/133
6,211,018 B1 * 4/2001 Nam et al. ................... 438/135

FOREIGN PATENT DOCUMENTS

JP  5-63202  3/1993

* cited by examiner

*Primary Examiner*—Tuan H. Nguyen
(74) *Attorney, Agent, or Firm*—Oblon, Spivak, McClelland, Maier & Neustadt, P.C.

(57) ABSTRACT

In order that the threshold value of a cell separated from an emitter wire bonding portion (W1, W2) be larger than that of a cell immediately below the emitter wire bonding portion, the area of a diffusion layer (8a) of a cell separated from the wire bonding portion is made larger than that of a diffusion layer (8) for connecting an emitter electrode (2) and a base region (7) in a cell immediately below the wire bonding portion. This allows a hole current to be discharged outside via an emitter wire within a short time period, without adversely affecting the operating characteristics and the steady loss, in a position where this hole current readily remains upon turn-off in a conventional IGBT. This shortens the fall time and reduces the switching loss.

16 Claims, 13 Drawing Sheets

EMBODIMENT IN WHICH AREA OF DIFFUSION REGION 8 FOR CONNECTING BASE REGION AND EMITTER REGION CONTINUOUSLY INCREASES AS DISTANCE FROM BONDING PORTION TO CELL INCREASES

EMBODIMENT IN WHICH AREA OF DIFFUSION REGION 8 FOR CONNECTING BASE REGION AND EMITTER REGION CONTINUOUSLY INCREASES AS DISTANCE FROM BONDING PORTION TO CELL INCREASES

EMBODIMENT IN WHICH IMPURITY CONCENTRATION OF BASE REGION RISES CONTINUOUSLY OR STEPWISE AS DISTANCE FROM BONDING PORTION TO CELL INCREASES

EMBODIMENT IN WHICH AREA OF DIFFUSION REGION 8 FOR CONNECTING BASE REGION AND EMITTER REGION INCREASES AND IMPURITY CONCENTRATION OF DIFFUSION REGION 8 RISES AS DISTANCE FROM BONDING PORTION TO CELL INCREASES

FIG. 11

EMBODIMENT IN WHICH AREA OF DIFFUSION REGION 8 FOR CONNECTING BASE REGION AND EMITTER REGION INCREASES AND IMPURITY CONCENTRATION OF BASE REGION RISES AS DISTANCE FROM BONDING PORTION TO CELL INCREASES

SEMICONDUCTOR DEVICE

CROSS REFERENCE TO RELATED APPLICATION

This application claims benefit of priority under 35 USC 119 to Japanese Patent Application No. 2000-320526, filed on Oct. 20, 2000, the entire contents of which are incorporated by reference herein.

BACKGROUND OF THE INVENTION

The present invention relates to a semiconductor device and, more particularly, to an insulated gate bipolar semiconductor device (to be referred to as an IGBT hereinafter) driven by a MOS gate.

Figure 13:
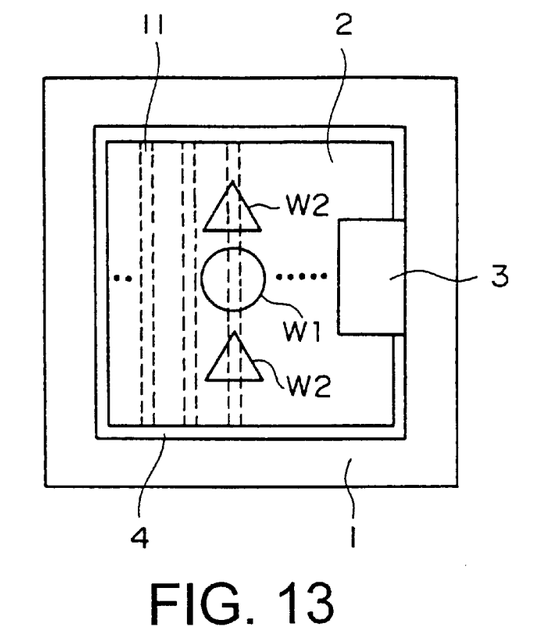
FIG. 13 is a plan view showing the planar arrangement of an IGBT chip related to the present invention.
Figure 14:
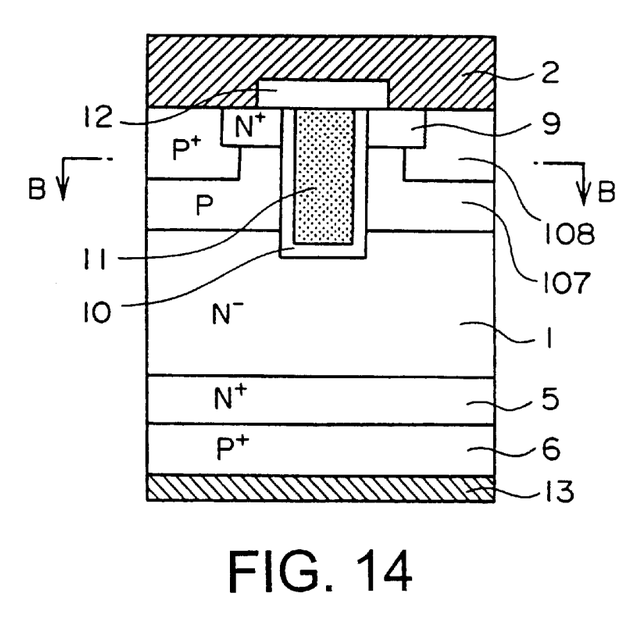
FIG. 14 is a longitudinal sectional view showing the longitudinal sectional structure of each cell in the IGBT.
Figure 15:
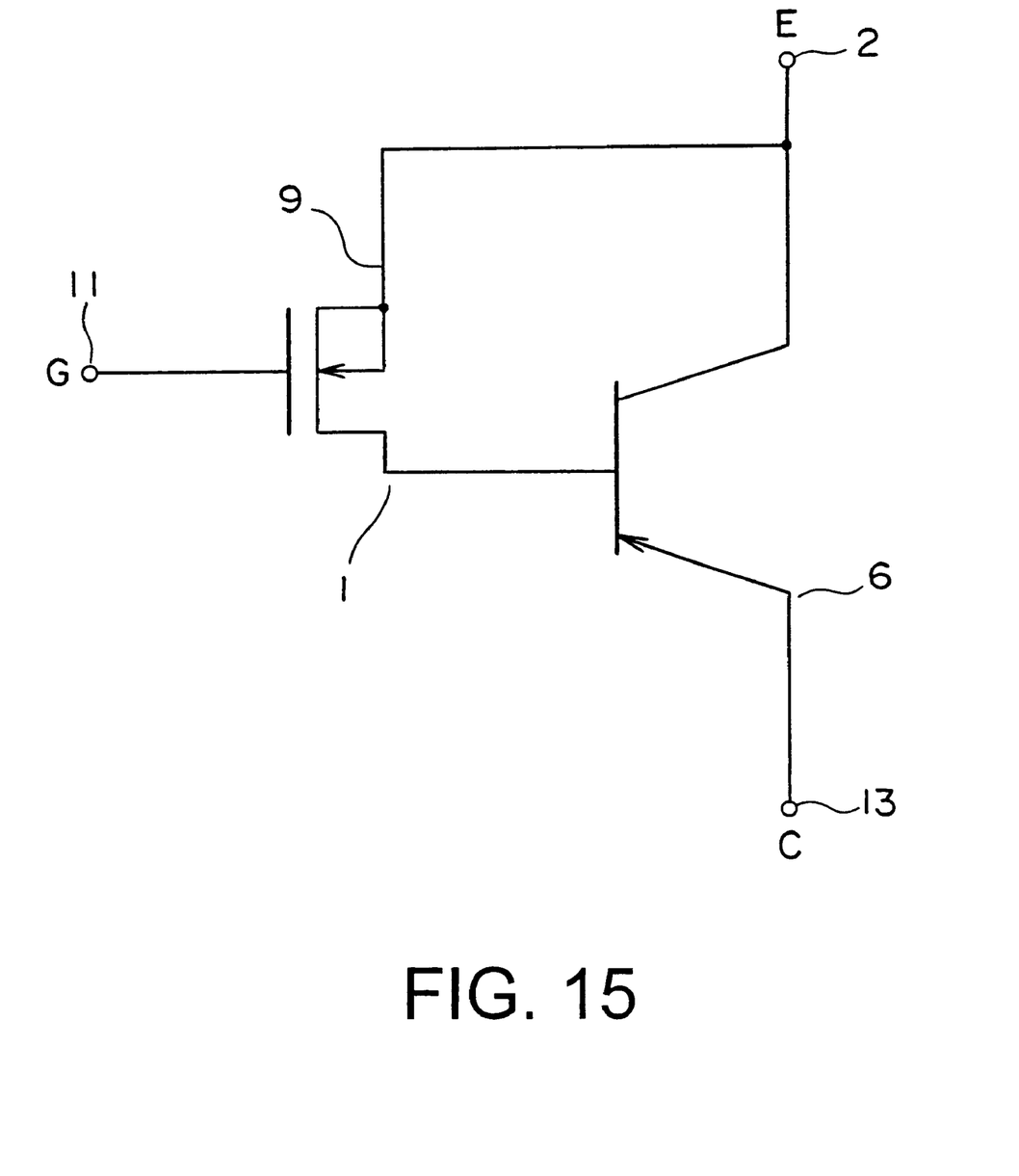
FIG. 15 is a circuit diagram showing the circuit configuration of the IGBT.

As an example of the configuration of an IGBT related to the present invention, FIG. 13 shows the upper surface of a trench IGBT chip, FIG. 14 shows the longitudinal sectional structure of each cell formed in this chip, and FIG. 15 shows the circuit configuration of the chip. A method of fabricating this trench IGBT will be described below.

On the surface of an $N^-$-type substrate 1 of a $P^+/N^+/N^-$-type epitaxial wafer having a $P^+$-type collector layer 6, an $N^+$-type buffer layer 5, and the $N^+$-type substrate 1, a P-type base region 107, a $P^+$-type diffusion region 108, and an $N^+$-type emitter region 9 are formed by impurity diffusion.

Next, trenches are formed through the P-type base region 107 and the $N^+$-type emitter region 9. A gate oxide film 10 is formed on the trench side walls, and polysilicon gate electrodes 11 are buried in these trenches.

On the surface of these polysilicon gate electrodes 11, an interlayer film 12 is formed and patterned to expose the surfaces of the $N^+$-type emitter region 9 and the $P^+$-type diffusion region 108. A collector electrode 13 is formed on the lower surface of the substrate 1, and an emitter electrode 2 is formed on the upper surface. In addition, a gate electrode 3 and a gate line 4 for the whole IGBT are formed. Referring to FIG. 13, a plurality of cells having the structure shown in FIG. 14 are arranged along a plurality of polysilicon gate electrodes 11 positioned below the emitter electrode 2.

Unfortunately, this IGBT related to the present invention has the following problem pertaining to the loss characteristics.

The IGBT loss characteristics include a steady loss and a switching loss, and it is required to reduce these losses.

A general approach is to downsize cells in the IGBT chip to lower the ON voltage (VCE (Sat)), thereby reducing the steady loss.

The switching loss is reduced by lowering a tail loss upon turn-off.

The ON voltage is lowered by downsizing cells by the use of a trench gate structure. On the other hand, the tail loss upon turn-of f is lowered by a method called lifetime control by which crystal defects are increased by irradiation of electron beams to thereby extinguish hole currents within short time periods. The method lowers the tail loss by reducing the carrier concentration, but has an adverse effect in lowing the ON voltage. That is, lowering the ON voltage and lowering the tail loss have a tradeoff relationship as a total loss. So, lowering the tail loss has not been well achieved yet.

Accordingly, it is necessary to lower the switching loss without deteriorating the reduction of the steady loss and the operating characteristics.

SUMMARY OF THE INVENTION

A semiconductor device of the present invention is an insulated gate bipolar semiconductor device in which a plurality of cells are formed, and an emitter region of each of the plurality of cells is connected to at least one emitter wire in at least one bonding portion via a common emitter electrode, wherein the threshold value of a cell farther from the bonding portion is larger than that of a cell closer to the bonding portion.

In this semiconductor device, to change the threshold value of a cell in accordance with the distance from the bonding portion to a cell, at least one of the impurity concentration of a base region and the impurity concentration and area of a diffusion region for connecting the base region and the emitter electrode may be changed.

The threshold value of a cell, the impurity concentration of the base region, and the impurity concentration and area of the diffusion region may continuously change in accordance with the distance from the bonding portion.

DESCRIPTION OF THE PREFERRED EMBODIMENTS

Embodiments of the present invention will be described below with reference to the accompanying drawings.

As described previously, in the IGBT related to the present invention, the threshold values of all cells are designed to be uniform so as to uniformly operate these cells.

That is, referring to FIG. 13, these cells are so evenly formed as to have the longitudinal sectional structure shown in FIG. 14, regardless of the distances from bonding portions of emitter wires bonded to the emitter electrode 2 (in FIG. 13, W1 denotes an emitter wire bonding portion where one wire is bonded; and W2, emitter wire bonding portions where two wires are bonded).

By contrast, this embodiment is characterized in that the threshold value of a cell becomes larger than that of a cell immediately below an emitter wire bonding portion W1 or W2 shown in FIG. 1, as the distance from the emitter wire bonding portion W1 or W2 increases.

Figure 6:
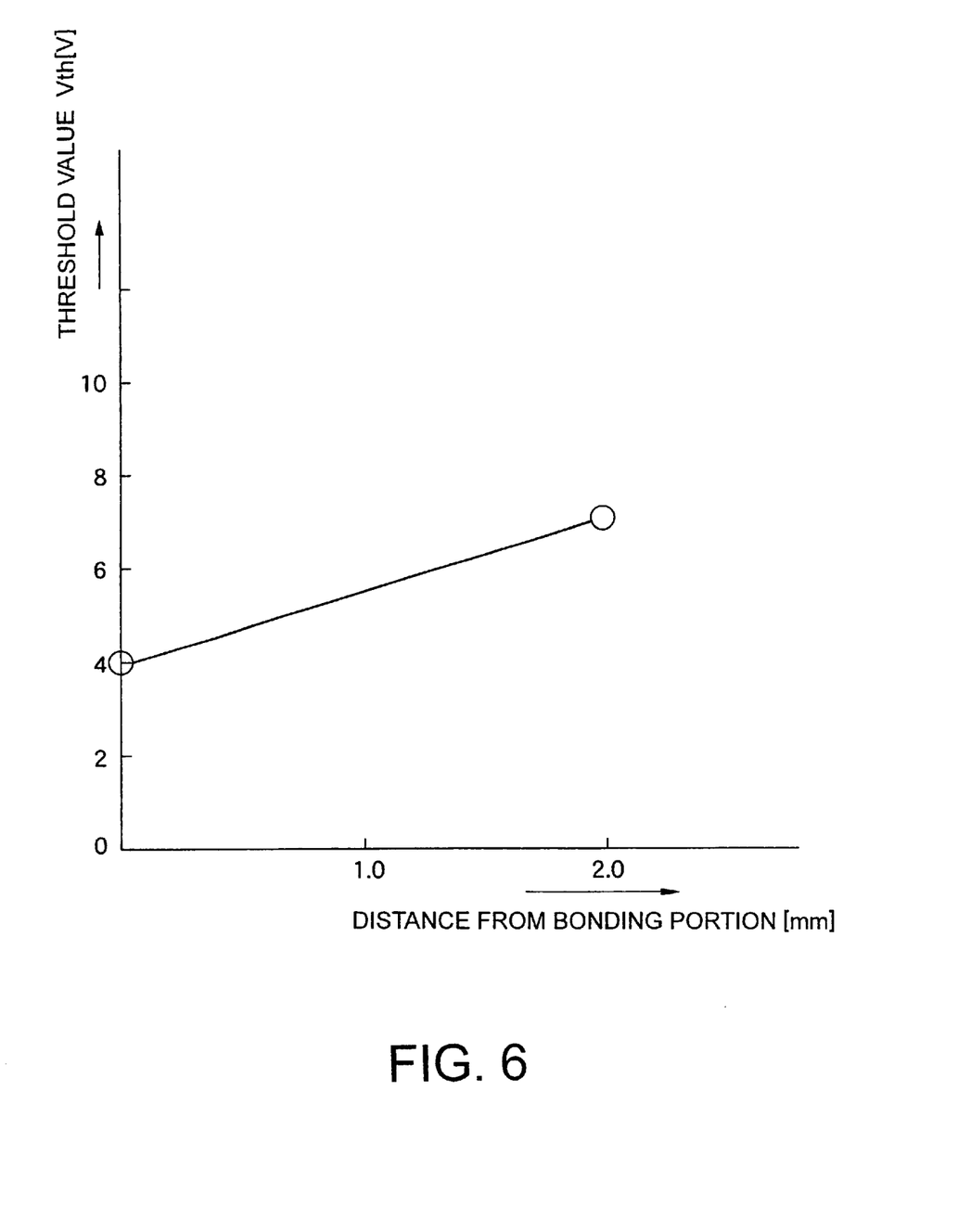
FIG. 6 is a graph showing the relationship between the threshold value of a cell and the distance to the emitter wire bonding portion in the IGBT.

For example, as shown in FIG. 6 which indicates the relationship between the emitter wire bonding portion W1 or W2 and a threshold value Vth, this threshold value Vth is 4 [V] when a cell is immediately below the bonding portion (zero distance). The threshold value increases as the distance increases, and is approximately 7 [V] when the distance is 2 [mm].

Accordingly, in a cell separated from the emitter wire bonding portion W1 or W2, a hole current remaining in the aforementioned IGBT related to the present invention upon turn-off is efficiently discharged outside from an emitter electrode 2 via an emitter wire at substantially the same timing as in a cell immediately below the wire. This shortens the fall time and reduces the switching loss.

Also, the device operates by that threshold characteristic of a cell positioned immediately below the emitter wire bonding portion, which matches the original standard. Therefore, the required turn-on characteristic and VCE (Sat) characteristic do not worsen, and the steady loss is reduced.

That is, this embodiment can well reduce the switching loss without deteriorating the reduction of the steady loss and the operating characteristics.

Figure 1:
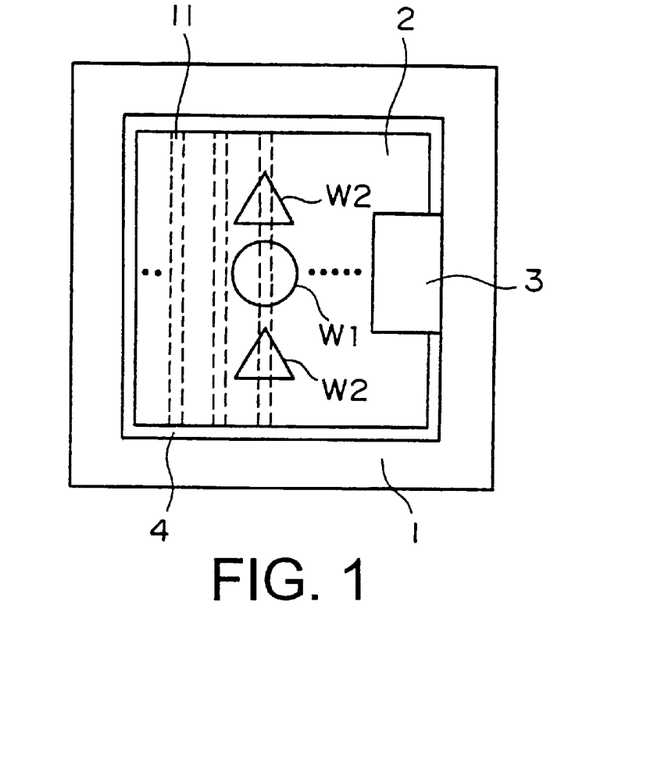
FIG. 1 is a plan view showing the planar arrangement of an IGBT chip according to an embodiment of the present invention.
Figure 2:
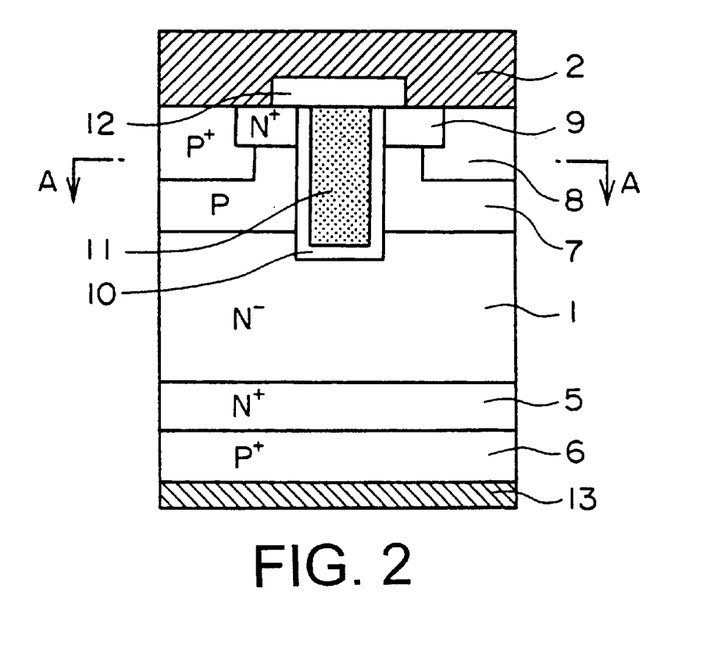
FIG. 2 is a longitudinal sectional view showing the longitudinal sectional structure of a cell positioned immediately below an emitter wire bonding portion, of a plurality of cells formed in the IGBT.
Figure 3:
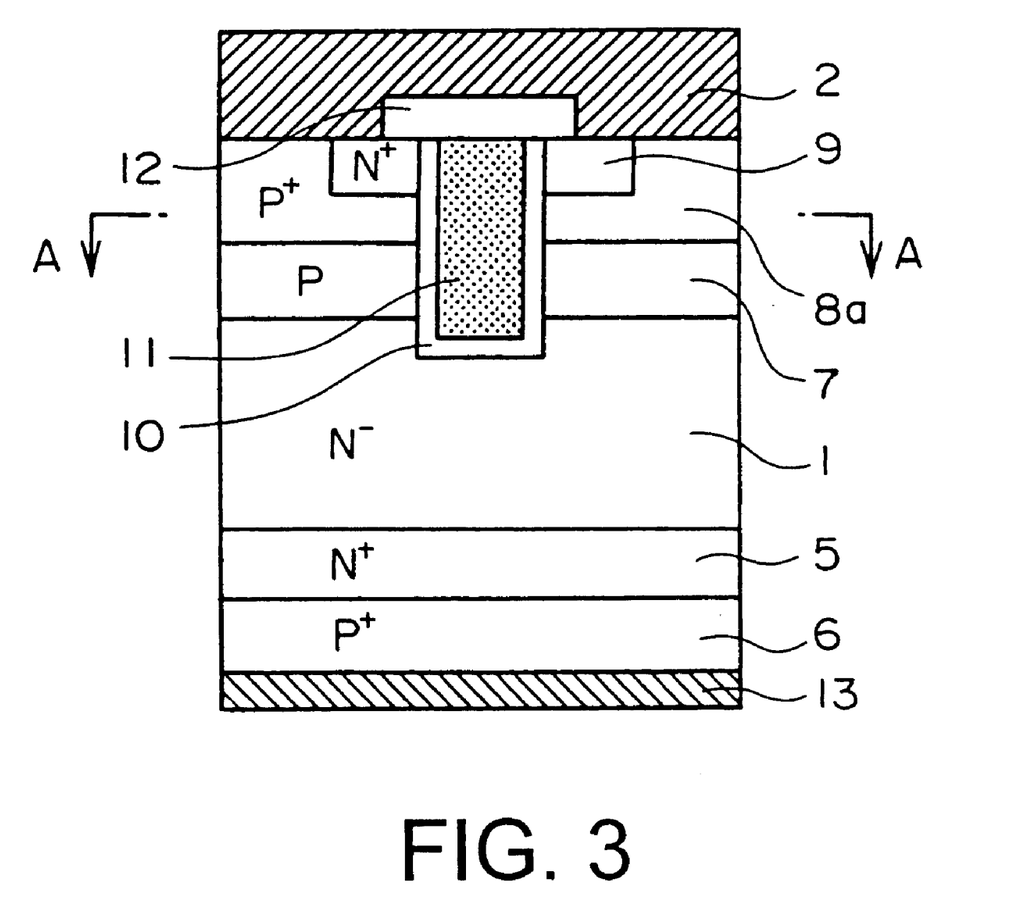
FIG. 3 is a longitudinal sectional view showing the longitudinal sectional structure of a cell positioned apart from the emitter wire bonding portion in the IGBT.
Figure 4:
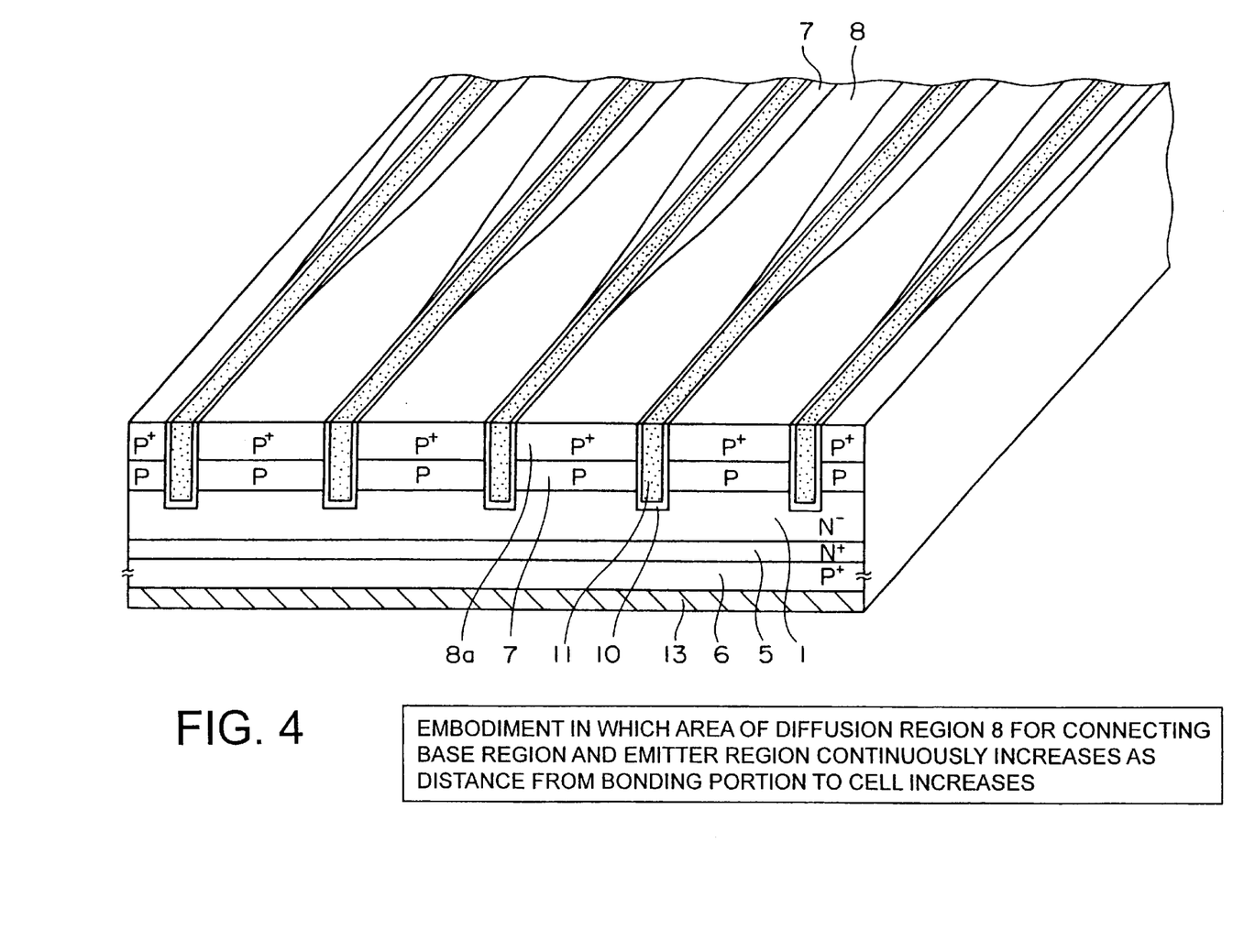
FIG. 4 is a perspective view showing an example of cross-sectional and longitudinal sectional structures taken along a line A—A in FIGS. 2 and 3.
Figure 5:
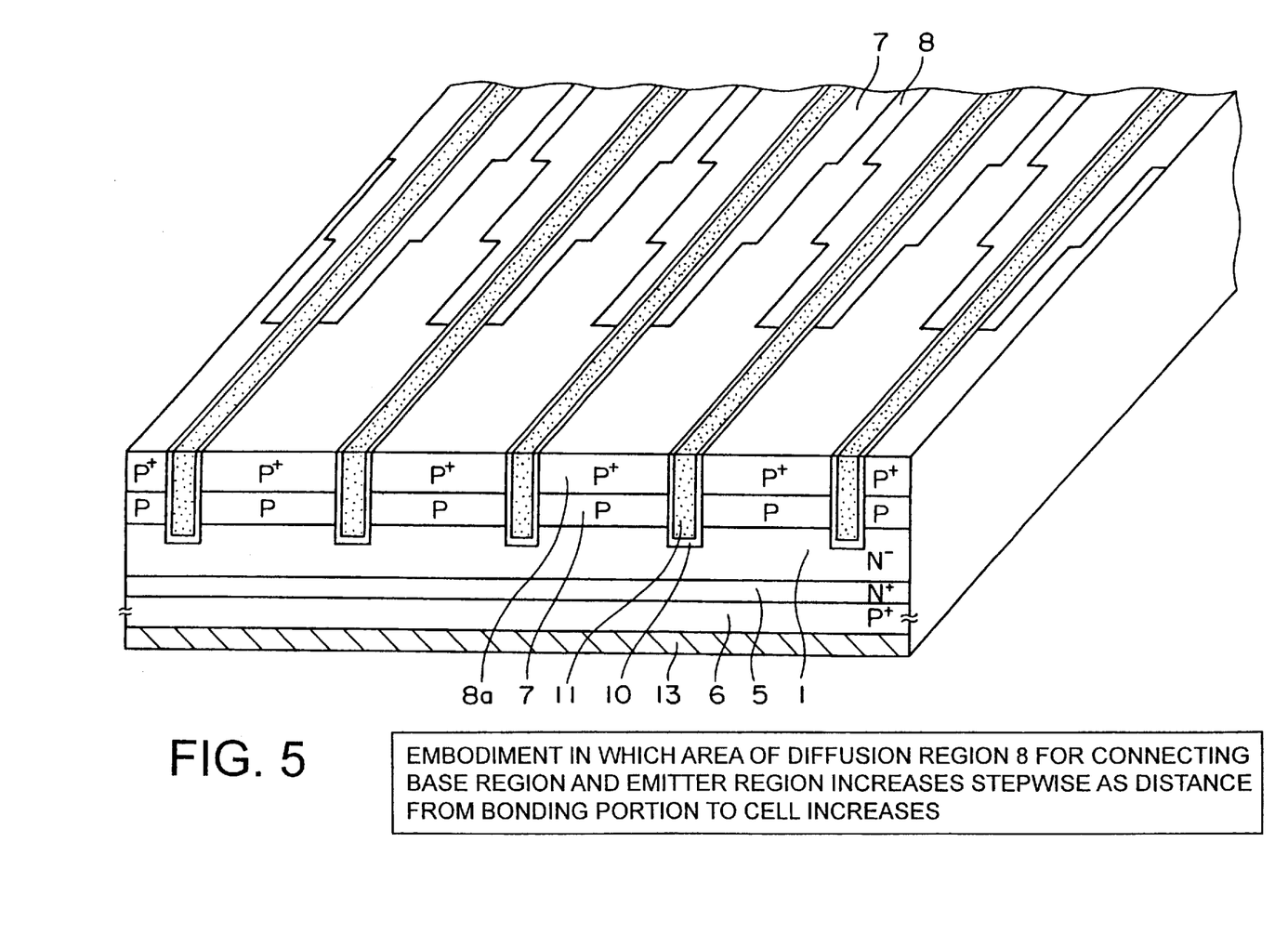
FIG. 5 is a perspective view showing another example of the cross-sectional and longitudinal sectional structures taken along the line A—A in FIGS. 2 and 3.

FIG. 1 shows a planar arrangement in which a trench IGBT chip according to the embodiment is viewed from the above. FIG. 2 shows the longitudinal sectional structure of a cell positioned immediately below the emitter wire bonding portion W1 or W2, of a plurality of cells formed in the IGBT chip. FIG. 3 shows the longitudinal sectional structure of a cell separated from the emitter wire bonding portion W1 or W2. FIG. 4 shows an example of a cross-sectional structure taken along a line A—A in FIGS. 2 and 3. FIG. 5 shows another example of the structure.

The longitudinal sectional structure of a cell positioned immediately below the emitter write bonding portion W1 or W2 is the same as that of a cell in the IGBT related to the present invention, explained with reference to FIG. 14, so a detailed description thereof will be omitted.

As shown in FIG. 3, in the longitudinal sectional structure of a cell separated from the emitter wire bonding portion W1 or W2, the area of a diffusion region 8a is made larger than that of a diffusion region 8 of a cell immediately below the emitter wire bonding portion. Since the area of the diffusion region 8a is thus large, the threshold value of this cell is larger than that of a cell immediately below the emitter wire bonding portion. Assume that the threshold value of a cell positioned immediately below the emitter wire bonding portion W1 or W2 is matched with the rated threshold value.

By the use of the above structure, a hole current is efficiently discharged from the emitter electrode 2 via an emitter wire upon turn-off. This can shorten the fall time and reduce the switching loss.

In addition, the entire chip operates by that threshold characteristic of a cell immediately below the emitter wire, which is matched with the required standard. So, the turn-on characteristic and the operating characteristics do not deteriorate. Accordingly, the necessary operating characteristics can be maintained, and the switching loss can be reduced without worsening the reduction of the steady loss.

The area of the diffusion region 8 of a cell immediately below the emitter wire bonding portion W1 or W2 and the area of the diffusion region 8a of a cell positioned apart from the emitter wire bonding portion W1 or W2 may continuously change as shown in FIG. 4 or may discontinuously change stepwise as shown in FIG. 5.

FIG. 1 shows the bonding portion W1 where one emitter wire is connected, and the bonding portions W2 where two emitter wires are connected. However, the present invention is applicable even when three or more emitter wires are connected. In any of these cases, the threshold value of a cell separated from the emitter wire bonding portion need only be made larger than that of a cell immediately below the emitter wire bonding portion.

The above embodiment is merely an example and hence does not limit the present invention. In the above embodiment, the areas of the diffusion regions 8 and 8a for connecting the emitter electrode 2 and a base region 7 are made different from each other, in order to make the threshold value of a cell positioned immediately below the emitter wire bonding portion different from that of a cell separated from the emitter wire bonding portion. However, the threshold values can also be made different by another method.

Figure 7:
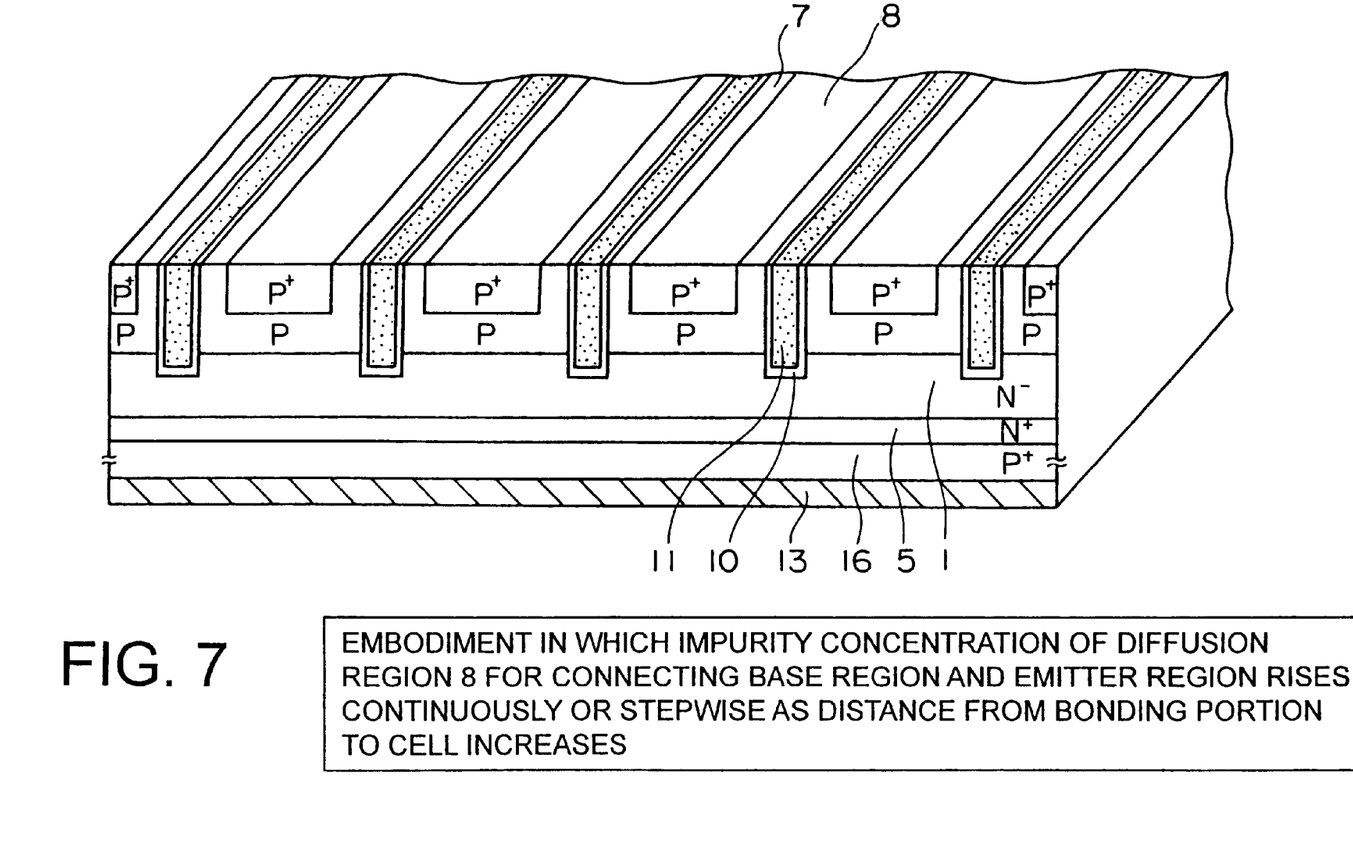
FIG. 7 is a perspective view showing still another example of the cross-sectional and longitudinal sectional structures taken along the line A—A in FIGS. 2 and 3.

In an embodiment shown in FIG. 7, the area of a diffusion region 8 for connecting a base region 7 and an emitter region 9 is constant regardless of the distance from a bonding portion to a cell. Instead, as the distance from the bonding portion to a cell increases, the impurity concentration of the diffusion region 8 rises continuously or stepwise.

Figure 8:
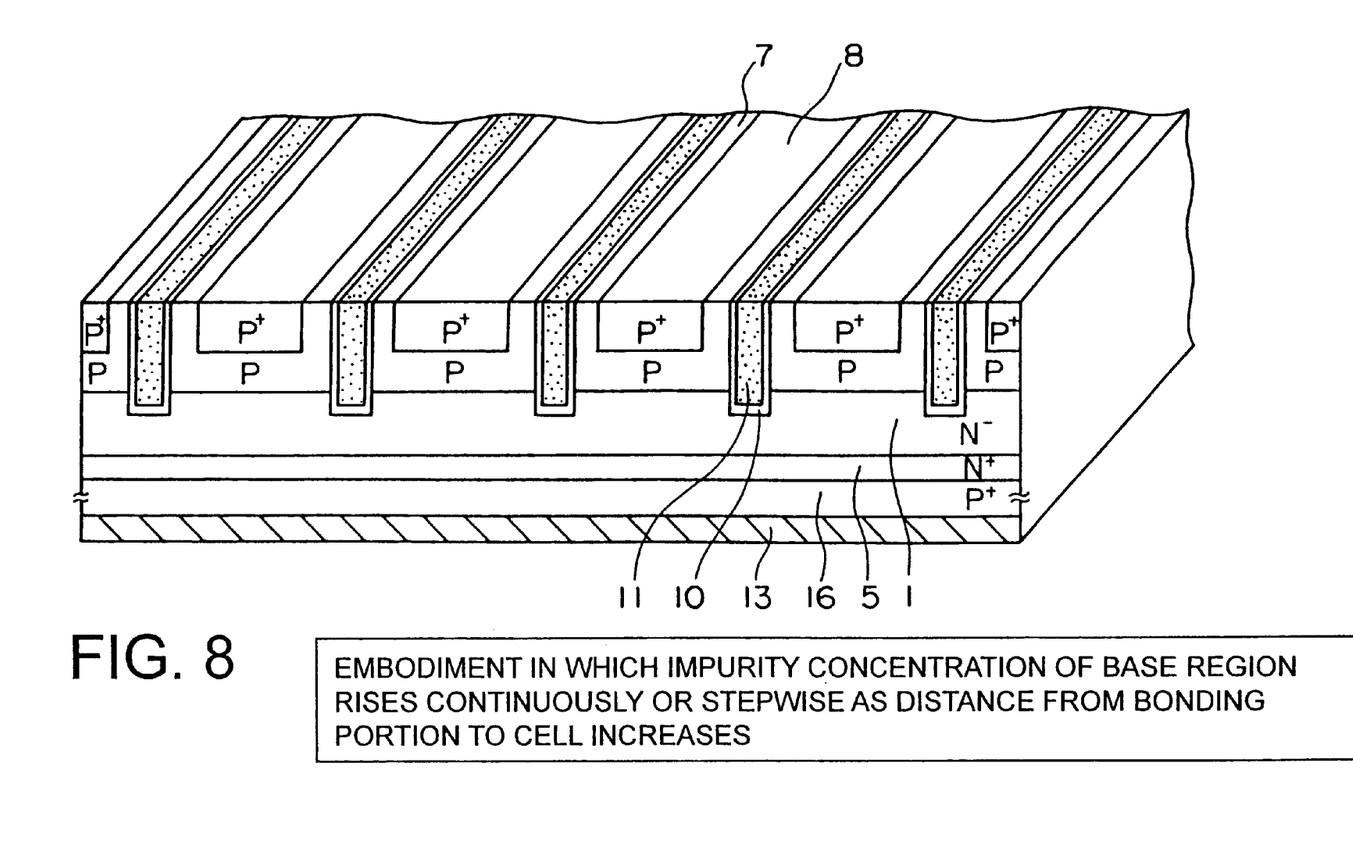
FIG. 8 is a perspective view showing still another example of the cross-sectional and longitudinal sectional structures taken along the line A—A in FIGS. 2 and 3.

In an embodiment shown in FIG. 8, the area of a diffusion region 8 for connecting a base region 7 and an emitter region 9 is constant regardless of the distance from a bonding portion to a cell. Instead, as the distance from the bonding portion to a cell increases, the impurity concentration of the base region 7 rises continuously or stepwise.

Figure 9:
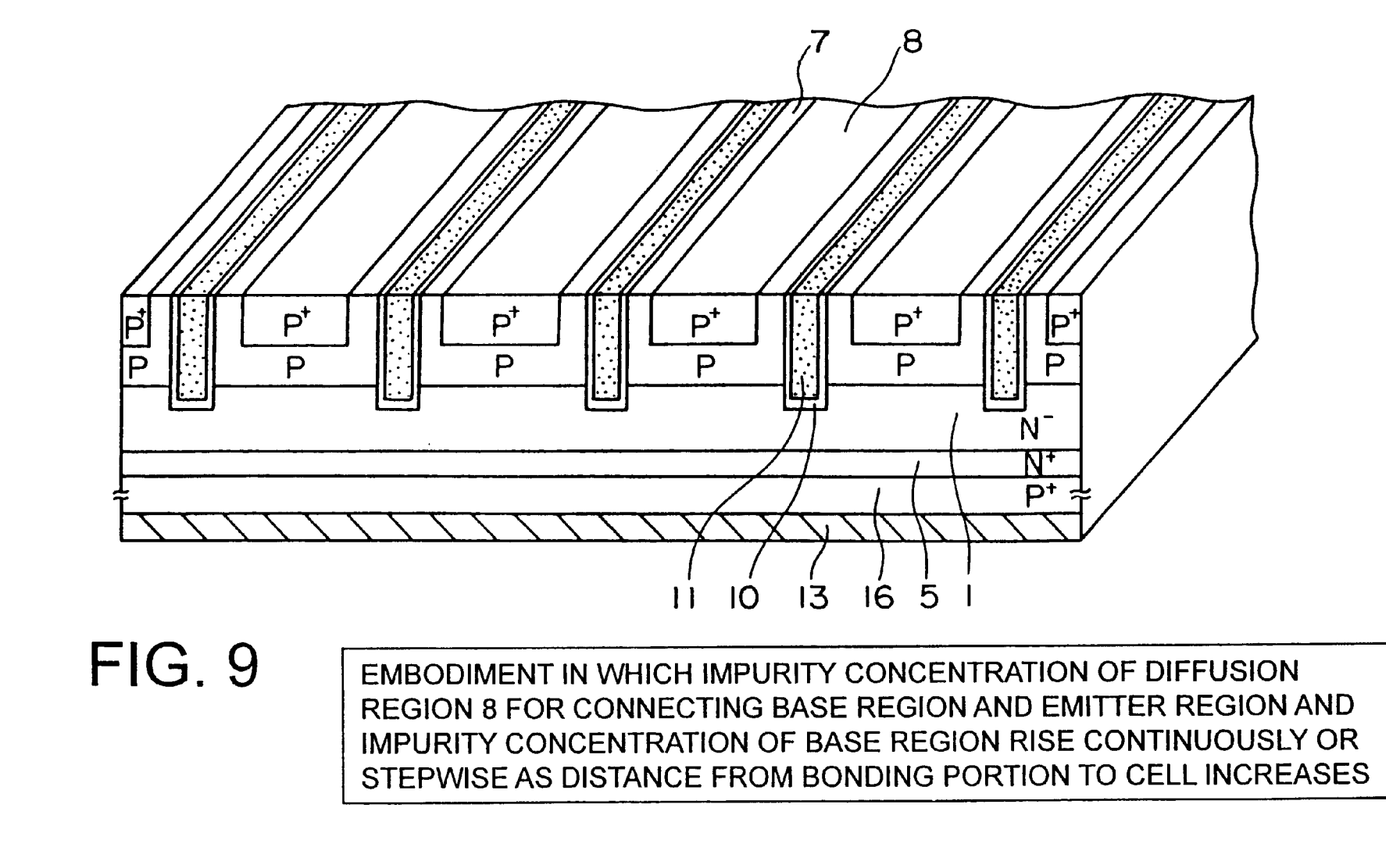
FIG. 9 is a perspective view showing still another example of the cross-sectional and longitudinal sectional structures taken along the line A—A in FIGS. 2 and 3.

In an embodiment shown in FIG. 9, the area of a diffusion region 8 for connecting a base region 7 and an emitter region 9 is constant regardless of the distance from a bonding portion to a cell. Instead, as the distance from the bonding portion to a cell increases, the impurity concentrations of the base region 7 and the diffusion region 8 rise continuously or stepwise.

Figure 10:
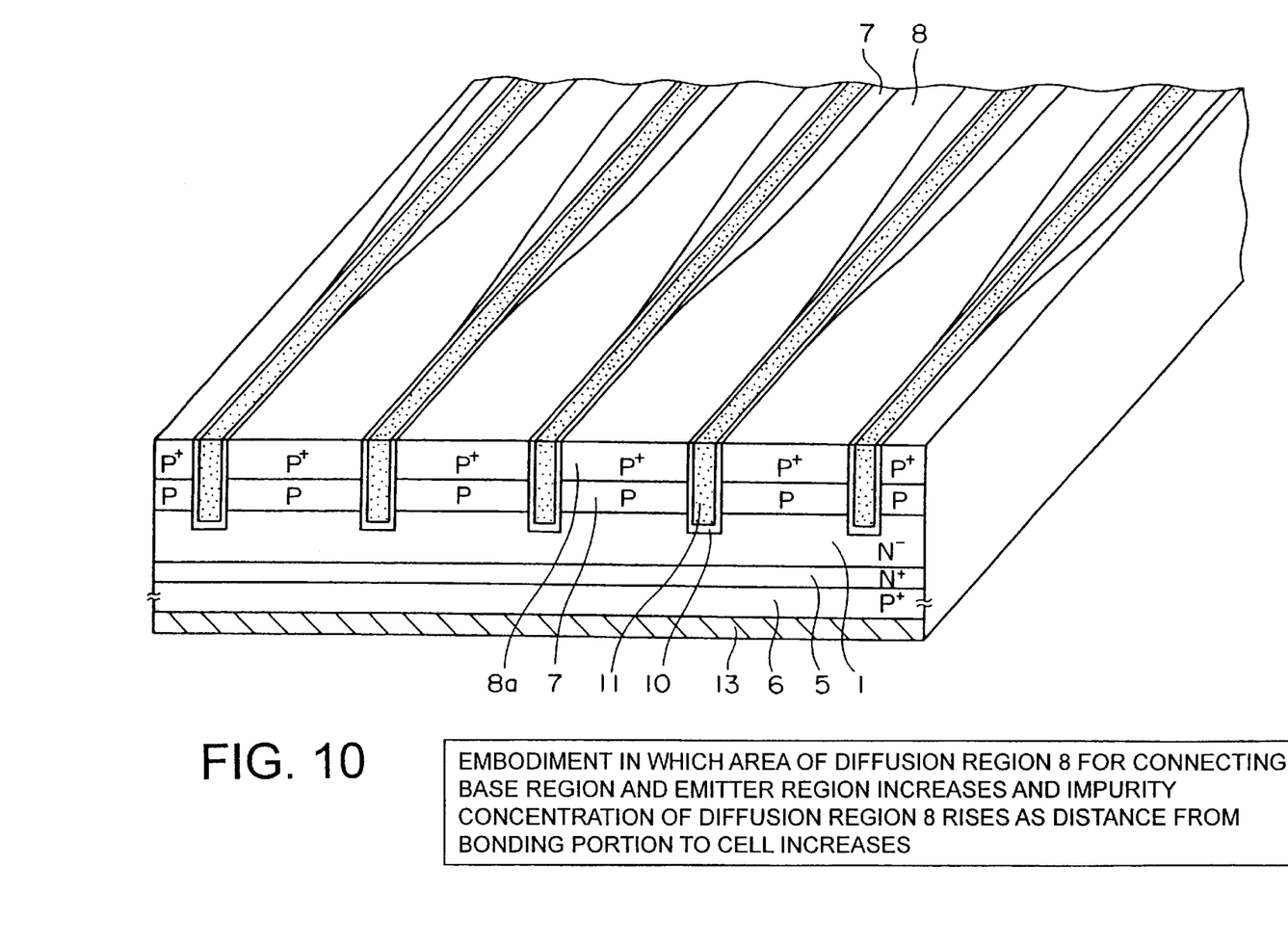
FIG. 10 is a perspective view showing still another example of the cross-sectional and longitudinal sectional structures taken along the line A—A in FIGS. 2 and 3.

In an embodiment shown in FIG. 10, as the distance from a bonding portion to a cell increases, the area of a diffusion region 8 for connecting a base region 7 and an emitter region 9 increases. In addition, as the distance from the bonding portion to a cell increases, the impurity concentration of the diffusion region 8 rises continuously or stepwise.

Figure 11:
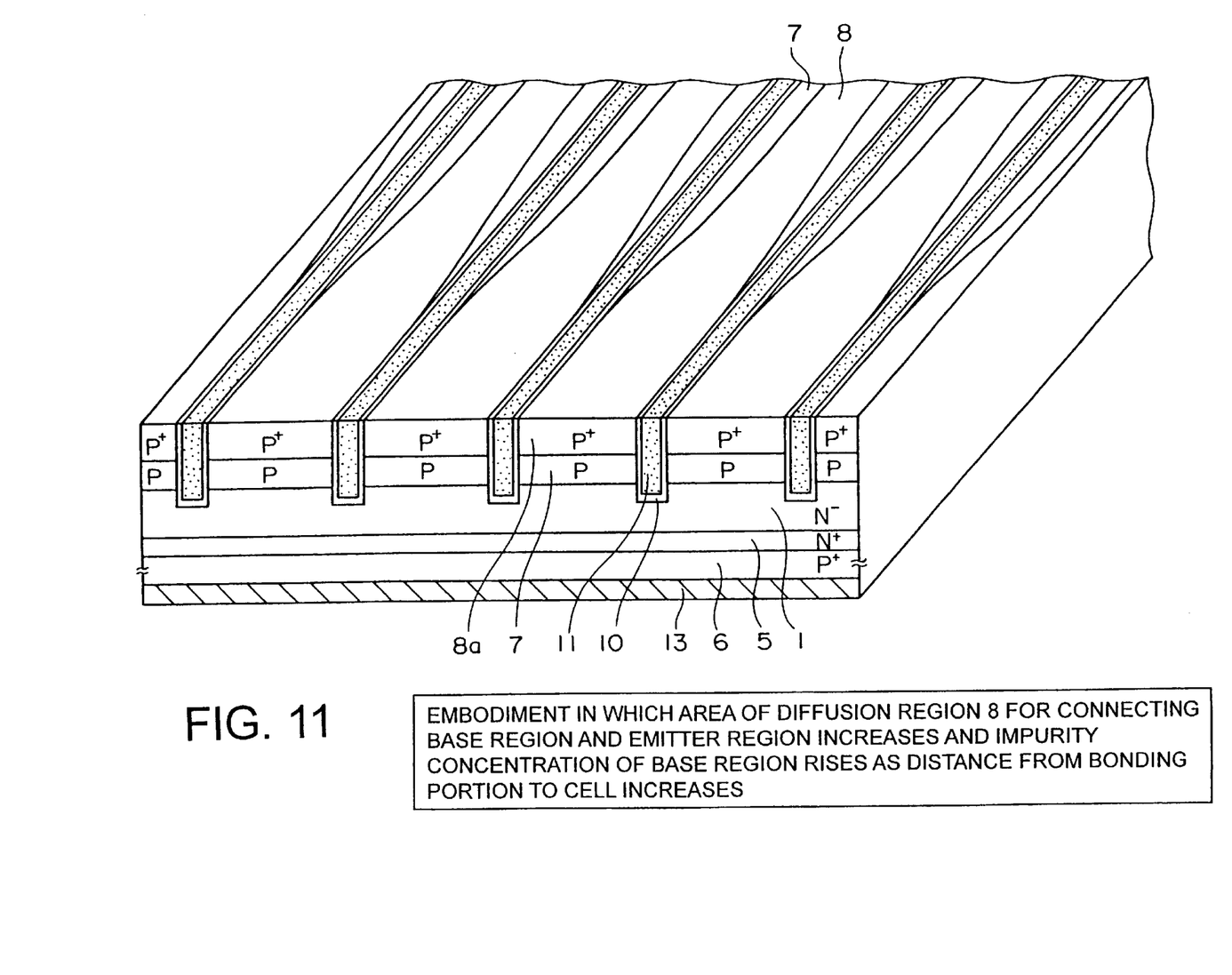
FIG. 11 is a perspective view showing still another example of the cross-sectional and longitudinal sectional structures taken along the line A—A in FIGS. 2 and 3.

In an embodiment shown in FIG. 11, as the distance from a bonding portion to a cell increases, the area of a diffusion region 8 for connecting a base region 7 and an emitter region 9 increases. In addition, as the distance from the bonding portion to a cell increases, the impurity concentration of the base region 7 rises continuously or stepwise.

Figure 12:
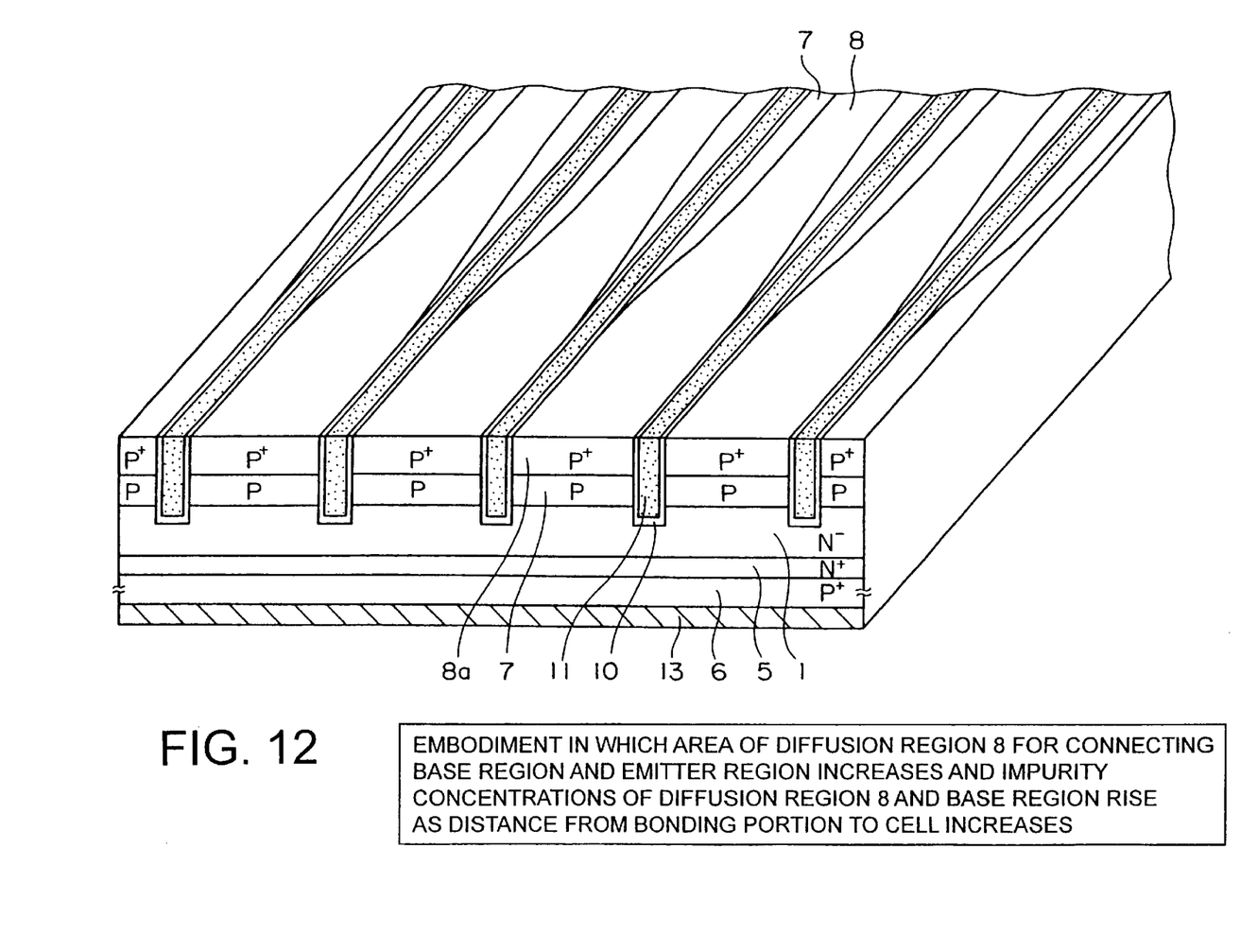
FIG. 12 is a perspective view showing still another example of the cross-sectional and longitudinal sectional structures taken along the line A—A in FIGS. 2 and 3.

In an embodiment shown in FIG. 12, as the distance from a bonding portion to a cell increases, the area of a diffusion region 8 for connecting a base region 7 and an emitter region 9 increases. In addition, as the distance from the bonding portion to a cell increases, the impurity concentrations of the base region 7 and the diffusion region 8 rise continuously or stepwise.

In each of the above embodiments as explained above, the threshold value of a cell farther from an emitter wire bonding portion is made larger that that of a cell closer to the emitter wire bonding portion. Therefore, that hole current in a cell separated from the emitter wire bonding portion, which easily remains in the IGBT related to the present invention upon turn-off, is discharged outside via an emitter wire within short time periods. This can shorten the fall time and reduce the switching loss.

What is claimed is:

1. An insulated gate bipolar semiconductor device in which a plurality of cells are formed, and an emitter region of each of said plurality of cells is connected to at least one emitter wire in at least one bonding portion via a common emitter electrode, wherein a threshold value of a cell farther from said bonding portion is larger than that of a cell closer to said bonding portion.

2. A device according to claim 1, wherein the threshold value of a cell continuously changes in accordance with a distance from said bonding portion.

3. A device according to claim 1, wherein an impurity concentration of a base region is higher in a cell farther from said bonding portion than in a cell closer to said bonding portion.

4. A device according to claim 3, wherein the impurity concentration of said base region continuously changes in accordance with a distance from said bonding portion.

5. A device according to claim 1, wherein an impurity concentration of a diffusion region for connecting a base region and said emitter electrode is higher in a cell farther from said bonding portion than in a cell closer to said bonding portion.

6. A device according to claim 5, wherein the impurity concentration of said diffusion region continuously changes in accordance with a distance from said bonding portion.

7. A device according to claim 1, wherein an area of a diffusion region for connecting a base region and said emitter electrode is larger in a cell farther from said bonding portion than in a cell closer to said bonding portion.

8. A device according to claim 7, wherein the area of said diffusion region continuously changes in accordance with a distance from said bonding portion.

9. A device according to claim 1, wherein an impurity concentration of a base region and an impurity concentration of a diffusion region for connecting said base region and said emitter electrode are higher in a cell farther from said bonding portion than in a cell closer to said bonding portion.

10. A device according to claim 9, wherein the impurity concentrations of said base region and said diffusion region continuously change in accordance with a distance from said bonding portion.

11. A device according to claim 1, wherein an impurity concentration of a base region is higher and an area of a diffusion region for connecting said base region and said emitter electrode is larger in a cell farther from said bonding portion than in a cell closer to said bonding portion.

12. A device according to claim 11, wherein the impurity concentration of said base region and the area of said diffusion region continuously change in accordance with a distance from said bonding portion.

13. A device according to claim 1, wherein an area of a diffusion region for connecting a base region and said emitter electrode is larger and an impurity concentration of said diffusion region is higher in a cell farther from said bonding portion than in a cell closer to said bonding portion.

14. A device according to claim 13, wherein the impurity concentration and area of said diffusion region continuously change in accordance with a distance from said bonding portion.

15. A device according to claim 1, wherein an impurity concentrations of a base region and a diffusion region for connecting said base region and said emitter electrode are higher and an area of said diffusion region is larger in a cell farther from said bonding portion than in a cell closer to said bonding portion.

16. A device according to claim 15, wherein the impurity concentrations of said base region and said diffusion region and the area of said diffusion region continuously change in accordance with a distance from said bonding portion.

\* \* \* \* \*